United States Patent
Zhao et al.

(10) Patent No.: US 8,872,321 B2
(45) Date of Patent: Oct. 28, 2014

(54) SEMICONDUCTOR PACKAGES WITH INTEGRATED HEAT SPREADERS

(75) Inventors: Sam Ziqun Zhao, Irvine, CA (US); Rezaur Rahman Khan, Rancho Santa Margarita, CA (US); Kevin Kunzhong Hu, Irvine, CA (US); Sampath K. V. Karikalan, Irvine, CA (US); Pieter Vorenkamp, Laguna Niguel, CA (US); Xiangdong Chen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 41 days.

(21) Appl. No.: 13/404,585

(22) Filed: Feb. 24, 2012

(65) Prior Publication Data

US 2013/0221506 A1 Aug. 29, 2013

(51) Int. Cl.
*H01L 23/48* (2006.01)
*H01L 23/495* (2006.01)

(52) U.S. Cl.
USPC .... 257/686; 257/675; 257/796; 257/E25.006; 257/E23.085; 257/E23.051

(58) Field of Classification Search
USPC .......... 257/675, 686, 706, E25.006, E25.013, 257/E25.021, E25.027, E23.085, 621, 777
See application file for complete search history.

(56) References Cited

U.S. PATENT DOCUMENTS

| | | | |
|---|---|---|---|
| 5,198,963 A | 3/1993 | Gupta | |
| 6,188,578 B1 * | 2/2001 | Lin et al. | 361/717 |
| 6,461,895 B1 | 10/2002 | Liang | |
| 6,709,898 B1 | 3/2004 | Ma | |
| 7,122,401 B2 * | 10/2006 | Song | 438/108 |
| 7,220,667 B2 | 5/2007 | Yamagata | |
| 7,585,702 B1 | 9/2009 | Wang | |
| 7,675,163 B2 * | 3/2010 | Heydari et al. | 257/704 |
| 7,834,450 B2 | 11/2010 | Kang | |
| 7,838,337 B2 | 11/2010 | Marimuthu | |
| 7,901,986 B2 | 3/2011 | Arai | |
| 7,906,857 B1 * | 3/2011 | Hoang et al. | 257/783 |
| 8,022,555 B2 | 9/2011 | Hwang | |
| 8,133,761 B2 | 3/2012 | Gerber | |
| 8,202,763 B2 | 6/2012 | Meyer | |
| 8,310,063 B2 | 11/2012 | Wang | |
| 8,344,516 B2 | 1/2013 | Chainer | |
| 8,461,672 B2 | 6/2013 | Haba | |
| 2003/0036219 A1 | 2/2003 | Masumoto | |

(Continued)

FOREIGN PATENT DOCUMENTS

KR 10-2011-0036249 4/2011

*Primary Examiner* — Jasmine Clark
(74) *Attorney, Agent, or Firm* — McDermott, Will & Emery LLP (57) ABSTRACT

One implementation of present disclosure includes a semiconductor package stack. The semiconductor package stack includes an upper package coupled to a lower package by a plurality of solder balls. The semiconductor package stack also includes a lower active die situated in a lower package substrate in the lower package. The lower active die is thermally coupled to a heat spreader in the upper package by a thermal interface material. An upper active die is situated in an upper package substrate in the upper package, the upper package substrate being situated over the heat spreader. The thermal interface material can include an array of aligned carbon nanotubes within a filler material. The heat spreader can include at least one layer of metal or metal alloy. Furthermore, the heat spreader can be connected to ground or a DC voltage source. The plurality of solder balls can be situated under the heat spreader.

20 Claims, 5 Drawing Sheets

(56) References Cited

U.S. PATENT DOCUMENTS

| | | |
|---|---|---|
| 2005/0218518 A1 | 10/2005 | Jiang |
| 2006/0145328 A1 | 7/2006 | Hsu |
| 2006/0186531 A1 | 8/2006 | Hsu |
| 2006/0186536 A1 | 8/2006 | Hsu |
| 2006/0220262 A1 | 10/2006 | Meyer |
| 2006/0258044 A1 | 11/2006 | Meyer |
| 2007/0132082 A1 | 6/2007 | Tang |
| 2007/0273049 A1 | 11/2007 | Khan |
| 2007/0290376 A1 | 12/2007 | Zhao |
| 2008/0044944 A1 | 2/2008 | Wakisaka |
| 2008/0157322 A1 | 7/2008 | Tang |
| 2008/0157328 A1* | 7/2008 | Kawata .................. 257/686 |
| 2008/0246138 A1 | 10/2008 | Gerber |
| 2008/0268638 A1 | 10/2008 | Dertinger |
| 2009/0053858 A1 | 2/2009 | Ko |
| 2009/0102030 A1 | 4/2009 | Khan |
| 2010/0019360 A1 | 1/2010 | Khan |
| 2010/0084754 A1 | 4/2010 | Yoo |
| 2010/0133534 A1 | 6/2010 | Do |
| 2011/0024888 A1 | 2/2011 | Pagaila |
| 2011/0024906 A1 | 2/2011 | Meyer |
| 2011/0241185 A1 | 10/2011 | Koester |
| 2011/0254160 A1 | 10/2011 | Tsai |
| 2011/0272819 A1 | 11/2011 | Park |
| 2011/0278732 A1 | 11/2011 | Yu |
| 2011/0285030 A1 | 11/2011 | Meyer |
| 2012/0018899 A1 | 1/2012 | Pagaila |
| 2012/0062439 A1 | 3/2012 | Liao |
| 2012/0139105 A1 | 6/2012 | Lin |
| 2012/0152605 A1 | 6/2012 | Das |
| 2012/0168942 A1 | 7/2012 | Gan |
| 2012/0211885 A1 | 8/2012 | Choi |
| 2012/0223429 A1 | 9/2012 | Khan |
| 2012/0225522 A1 | 9/2012 | Zhao |
| 2012/0228753 A1 | 9/2012 | Ko |
| 2012/0241921 A1 | 9/2012 | Lee |
| 2012/0319293 A1 | 12/2012 | Cheah |
| 2013/0000968 A1 | 1/2013 | Zhao |
| 2013/0062764 A1 | 3/2013 | Jin |
| 2013/0075917 A1 | 3/2013 | Law |
| 2013/0113098 A1 | 5/2013 | Hwang |
| 2013/0147023 A1 | 6/2013 | Lin |

* cited by examiner

SEMICONDUCTOR PACKAGES WITH INTEGRATED HEAT SPREADERS

BACKGROUND

Semiconductor packages continue to become physically and functionally denser, causing the semiconductor packages to draw more power and thus generate more heat. As such, issues related to heat dissipation have become an important aspect of semiconductor package design. Furthermore, semiconductor packages may be exposed to a wide range of temperatures. Thus, another important aspect of semiconductor package design includes addressing potential problems related to thermal expansion. For example, expansion and contraction of various constituents in a semiconductor package can introduce significant stress that can jeopardize the integrity of the semiconductor package. Various approaches have been developed to address heat related issues in semiconductor package design. In one approach, a heat spreader is attached to a semiconductor package. However, amongst other issues, the heat spreader is increasingly large and costly to effectively dissipate heat from the semiconductor package.

SUMMARY

The present disclosure is directed to semiconductor packages with integrated heat spreaders, substantially as shown in and/or described in connection with at least one of the figures, and as set forth more completely in the claims.

DETAILED DESCRIPTION

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 1:
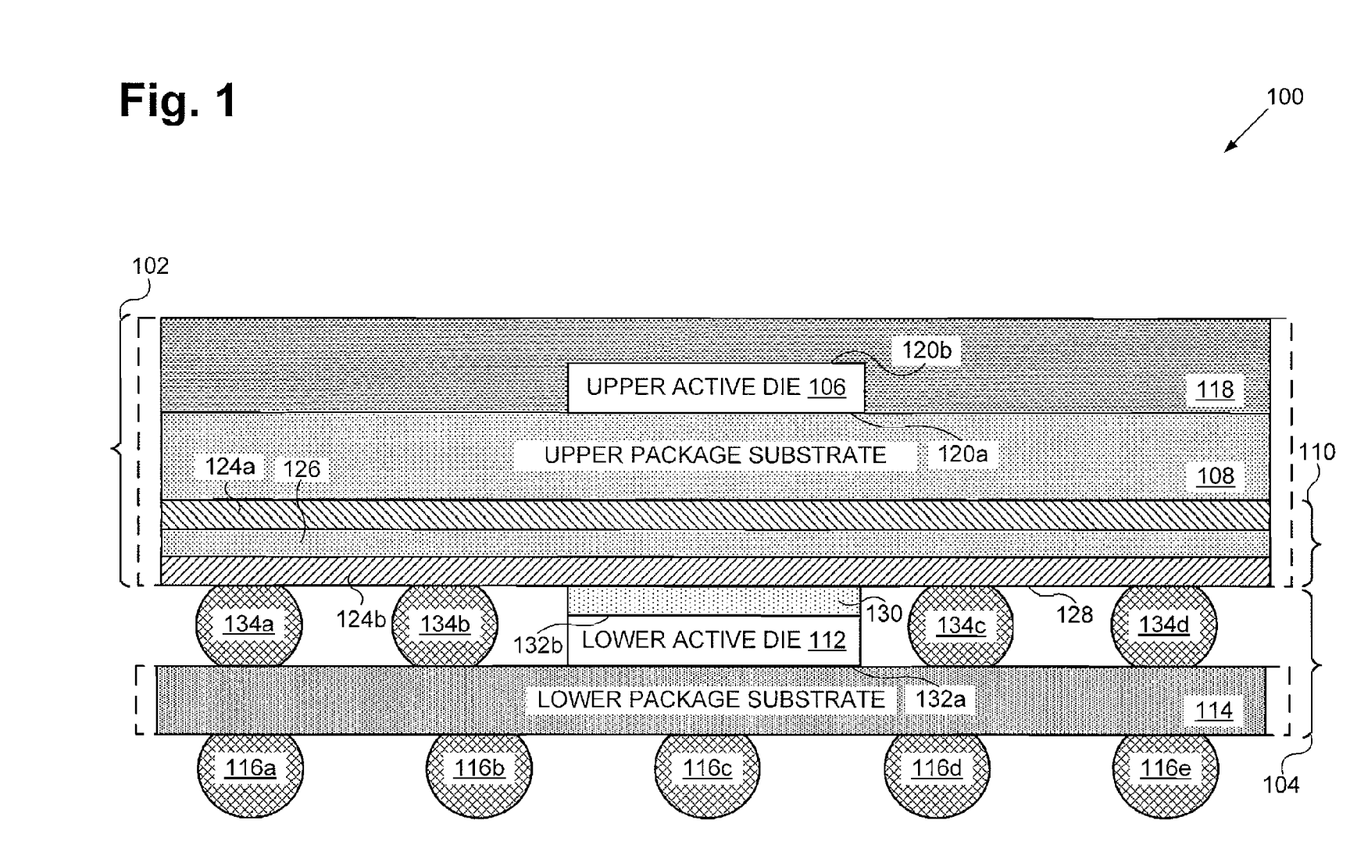
FIG. 1 presents an exemplary cross-sectional view of a semiconductor package stack, according to an implementation disclosed in the present application.

FIG. 1 presents an exemplary cross-sectional view of semiconductor package stack 100, according to an implementation disclosed in the present application. Semiconductor package stack 100 includes upper package 102 situated over lower package 104. Upper package 102 includes upper active die 106, upper package substrate 108, heat spreader 110, and molding 118. Lower package 104 includes lower active die 112, and lower package substrate 114. Semiconductor package stack 100 can also include many different structures and features, which are omitted from FIG. 1 for clarity.

As shown in FIG. 1, in upper package 102, upper active die 106 is situated in upper package substrate 108 and upper package substrate 108 is situated over heat spreader 110. In various implementations, upper active die 106 includes at least one active component and can also include one or more passive components. Upper active die 106 can be, for example, a semiconductor die, such as a silicon die.

In the present implementation, upper active die 106 is over upper package substrate 108. Non-limiting examples of upper package substrate 108 include organic-substrates and laminate substrates. In some implementations, upper active die 106 is electrically connected to upper package substrate 108. For example, upper active die 106 can include a plurality of terminals electrically connected to upper package substrate 108, which can be an interposer. The plurality of terminals can be on surface 120a and/or 120b of upper active die 106. In some implementations, upper active die 106 has a plurality of micro bumps (not shown in FIG. 1) situated on surface 120a that is electrically coupling upper active die 106 to upper package substrate 108. Also, in some implementations, upper active die 106 has one or more wires, such as bond wires (not shown in FIG. 1), on surface 120b that to electrically couple upper active die 106 to upper package substrate 108.

In some implementations, upper package substrate 108 is a ball-grid array (BGA) substrate. FIG. 1 shows solder balls 134a, 134b, 134c, and 134d (also referred to as "solder balls 134"). In various implementations, upper package substrate 108, and thereby upper active die 106, can be electrically connected to at least some solder balls 134, or to other solder balls not shown in FIG. 1. However, in various implementations, upper package substrate 108 can be different types of substrates. Furthermore, upper active die 106 is not electrically connected to solder balls 134 or any solder balls in some implementations.

As shown in FIG. 1, upper active die 106 is within molding 118 of upper package 102. Although molding 118 covers surface 120b of upper active die 106, in some implementations, surface 120b exposed through molding 118. Furthermore, in some implementations, upper package 102 does not include molding 118. In some implementations a heat spreader is thermally coupled to upper active die 106 through surface 120b.

Heat spreader 110 is on surface 128 of upper package 102 and is thermally conductive. More particularly, heat spreader 110 includes one or more layers of thermally conductive material or materials. In the present implementation, heat spreader 110 includes electrically conductive materials 124a and 124b (which are also thermally conductive materials) and heat spreader dielectric 126. Heat spreader dielectric 126 is situated between electrically conductive materials 124a and 124b. Electrically conductive materials 124a and 124b can be, for example, layers of metal or metal alloy. For example, each of electrically conductive materials 124a and 124b can be a layer of copper. In some implementations, electrically conductive materials 124a and 124b are each substantially uninterrupted layers of electrically conductive material. Electrically conductive materials 124a and 124b can include different materials with respect to one another and can also have differing thicknesses. In various implementations, heat spreader 110 includes additional layers not specifically described herein or can have less layers. For example, in one implementation, heat spreader 110 has only one layer similar to electrically conductive materials 124a and 124b.

Electrically conductive materials 124a and 124b and heat spreader dielectric 126 are shown as spanning the lateral extent of upper package 102. However, heat spreader 110 is not limited to what is shown in FIG. 1. For example, heat spreader 110 can have different shapes, sizes, and compositions from what is shown in FIG. 1. In one implementation, heat spreader 110 is a single layer of electrically conductive material. In some implementations, heat spreader 110 does not include a dielectric. Furthermore, any portion of upper package 102 can extend at least laterally beyond what is shown in FIG. 1, as indicated by dashed lines. These regions can include other features, which may not be specifically described herein. More particularly, dashed lines in FIG. 1 generally indicate possible additional structure not shown in FIG. 1. In various implementations, at least a portion of heat spreader 110 spans the lateral extent of lower active die 112. Also, in various implementations, at least a portion of heat spreader 110 spans the lateral extent of upper active die 106. Furthermore, heat spreader 110 can include conductive vias and/or other structure not specifically shown in FIG. 1. In some implementations, conductive vias and/or other thermally and/or electrically conductive structures connect electrically conductive materials 124a and 124b through heat spreader dielectric 126.

In lower package 104, lower active die 112 can generate heat during operation of semiconductor package stack 100. As semiconductor packages, such as lower package 104, become functionally denser, they continue to draw more power and thus generate more heat. In the present implementation, lower active die 112 is situated in lower package substrate 114 and lower active die 112 is thermally coupled to heat spreader 110 in upper package 102 by thermal interface material 130. Thus, in accordance with implementations disclosed in the present application, upper package 102, and more particularly, heat spreader 110 of upper package 102, is utilized to dissipate heat from lower active die 112. As heat spreader 110 is part of upper package 102, heat spreader 110 can be small, inexpensive, and easy to include in semiconductor package stack 100. Furthermore, in some implementations, heat spreader 110 thermally shields upper package 102 from lower package 104. Thus, for example, design considerations, such as those related to thermal expansion and heat dissipation in semiconductor package stack 100 can be simplified.

As described above, lower active die 112 is thermally coupled to heat spreader 110 in upper package 102 by thermal interface material 130. However, it is noted that in some implementations, lower active die 112 is in direct thermal contact with heat spreader 110. Thermal interface material 130 enhances thermal contact between lower active die 112 and heat spreader 110. Non-limiting examples of thermal interface material 130 include thermal paste, thermal grease, and thermal pads. In some implementations, thermal interface material 130 is electrically conductive and in some implementations, thermal interface material 130 is electrically insulative. As one example, thermal interface material 130 can electrically connect lower active die 112 to heat spreader 110 through surface 132b of lower active die 112.

Figure 2A:
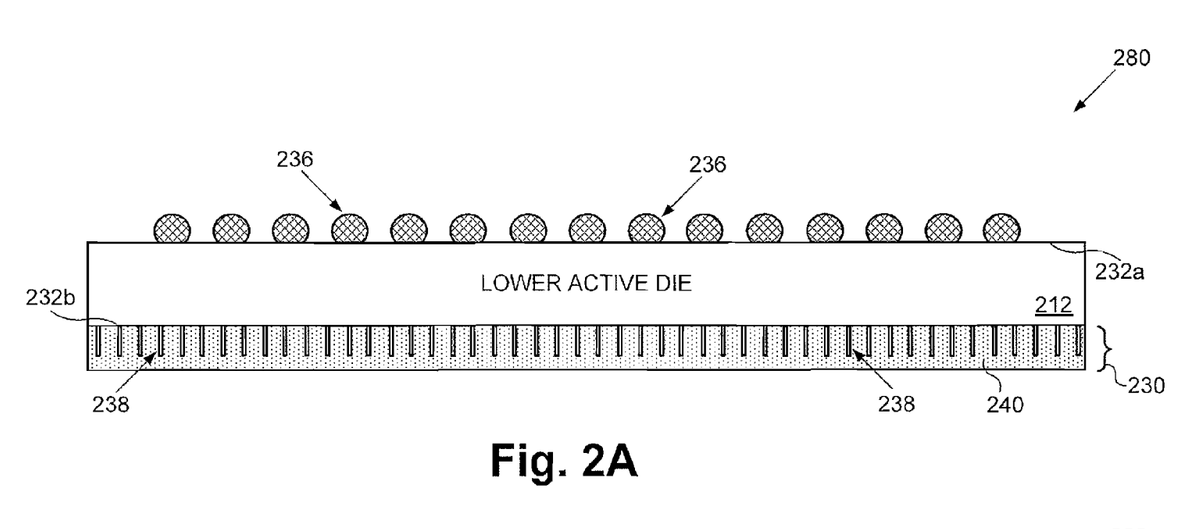
FIG. 2A presents an exemplary cross-sectional view of a structure including an active die, according to an implementation disclosed in the present application.
Figure 2B:
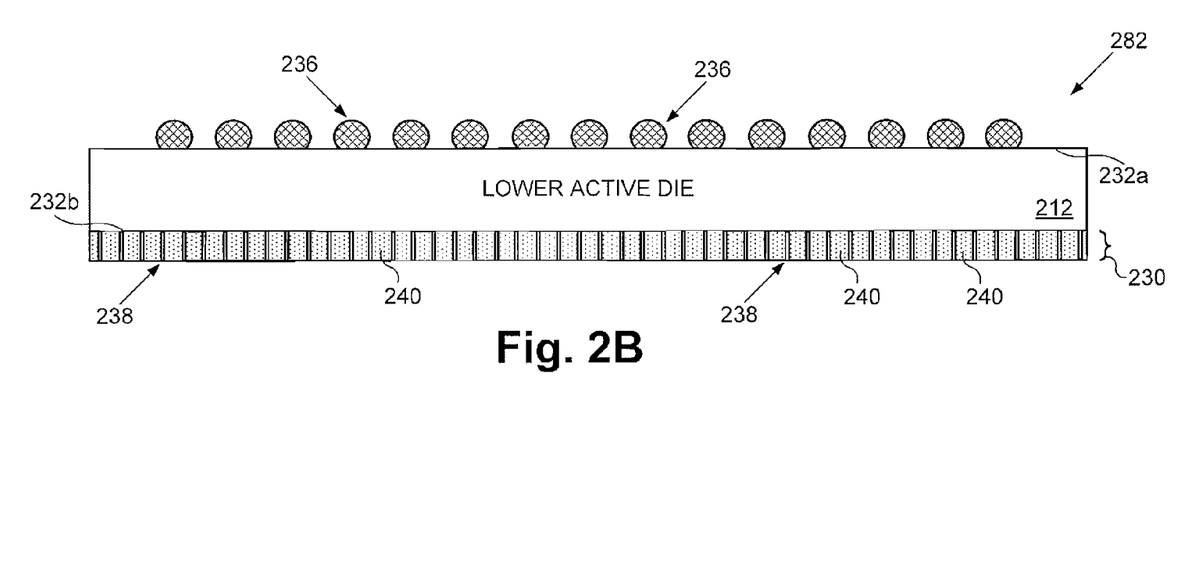
FIG. 2B presents an exemplary cross-sectional view of a structure including an active die, according to an implementation disclosed in the present application.

Referring now to FIGS. 2A and 2B, FIGS. 2A and 2B present exemplary cross-sectional views of structures 280 and 282 including lower active die 212, according to implementations disclosed in the present application. FIGS. 2A and 2B, show lower active die 212 and thermal interface material 230, which correspond to lower active die 112 and thermal interface material 130 in FIG. 1, in accordance with some implementations of the present disclosure. As shown in FIGS. 2A and 2B, lower active die 212 is electrically connected to micro bumps 236 on surface 232a, corresponding to surface 132a in FIG. 1. Thermal interface material 230 is situated on surface 232b, corresponding to surface 132b in FIG. 1.

In the implementations shown in FIGS. 2A and 2B, thermal interface material 230 includes aligned carbon nanotubes 238 within filler material 240. Aligned carbon nanotubes 238 are vertically aligned in the present implementation, are excellent thermal conductors, and are mechanically compliant. In the implementations shown in FIGS. 2A and 2B, aligned carbon nanotubes 238 are grown on lower active die 212, and thus directly contact surface 232b of lower active die 212, which can be silicon.

In some implementations, filler material 240 is thermally conductive. Also, filler material 240 can optionally be electrically conductive. Filler material 240 can be, for example, epoxy, such as a dielectric epoxy. In structure 280, shown in FIG. 2A, filler material 240 covers tips of aligned carbon nanotubes 238. In structure 282, shown in FIG. 2B, tips of aligned carbon nanotubes 238 are exposed through filler material 240. For example, a chemical mechanical planarization can be performed on structure 280 to expose tips of aligned carbon nanotubes 238 through filler material 240. Thus, aligned carbon nanotubes 238 can extend from lower active die 212 to a heat spreader, such as heat spreader 110 in FIG. 1. Doing so can enhance thermal conductivity of thermal interface material 230.

Returning to FIG. 1, lower active die 112 can be similar to or different than upper active die 106. For example, lower active die 112 includes at least one active component and can also include one or more passive components. Furthermore, lower active die 112 can be, for example, a semiconductor die, such as a silicon die. It is noted that in some implementations, at least one of upper and lower packages 102 and 104 include additional dies and/or electrical components not shown in FIG. 1.

In the present implementation, lower active die 112 is over lower package substrate 114. Non-limiting examples of lower package substrate 114 include organic-substrates and laminate substrates. In some implementations, lower active die 112 is electrically connected to lower package substrate 114. For example, lower active die 112 can include a plurality of terminals electrically connected to lower package substrate 114, which can be an interposer. The plurality of terminals can be on surface 132a and/or 132b. In one implementation, lower active die 112 has a plurality of micro bumps (e.g. micro bumps 236 in FIGS. 2A and 2B) situated on surface 132a that is electrically coupling lower active die 112 to lower package substrate 114.

In some implementations, lower package substrate 114 is a BGA substrate electrically connected to at least some of solder balls 116a, 116b, 116c, 116d, and 116e (also referred to as "solder balls 116"). However, in various implementations, lower package substrate 114 can be different types of substrates. In the present implementation, solder balls 116 are electrically connected to lower package substrate 114. Additionally, solder balls 116 are electrically connected to lower active die 112 through lower package substrate 114. However, various implementations do not include solder balls 116.

Furthermore, lower active die 112 is not electrically connected to lower package substrate 114 in some implementations.

Upper package 102 is coupled to lower package 104. In the present implementation, upper package 102 is coupled to lower package 104 by solder solder balls 134. Also in the present implementation, solder balls 134 are situated under heat spreader 110. More particularly, solder balls 134 are situated on electrically conductive material 124b. Solder balls 134 can be arranged in a grid, or other formation under heat spreader 110. It is noted that some implementations do not include solder balls 134.

Solder balls 134 can enhance structural integrity of semiconductor package stack 100. Furthermore, as solder balls 134 are thermally conductive, solder balls 134 can enhance thermal dissipation and heat spreading. In some implementations, solder balls 134 are thermally coupled to lower active die 112. For example, solder balls 134 can be situated on one or more conductive layers, such as metal layers, in lower package substrate 114. The one or more conductive layers can be thermally coupled to lower active die 112. While semiconductor package stack 100 has solder balls 134, in other implementations, semiconductor package stage 100 includes conductive blocks, thermal interface material, molding, epoxy, and/or other materials instead of or in addition to solder balls 134. In one implementation, heat spreader 110 (e.g. electrically conductive material 124b) has at least one portion that extends to contact lower package substrate 114. As one example, electrically conductive material 124b can be etched to have a plurality of conductive pillars (not shown in FIG. 1).

In some implementations, heat spreader 110 is connected to ground. For example, electrically conductive material 124a and/or electrically conductive material 124b can be connected to ground. By doing so, semiconductor package stack 100 can have, for example, enhanced shielding from electrical noise. Also, in some implementations, heat spreader 110 is connected to "power," for example a constant DC supply voltage. Thus, for example, electrically conductive material 124a and/or electrically conductive material 124b can be connected to power. In some implementations, heat spreader 110 is connected to ground or power through at least one of solder balls 116 and lower package substrate 114.

In various implementations, heat spreader 110 can be electrically connected to any combination of, or neither of, upper active die 106 and lower active die 112. Furthermore, in some implementations, heat spreader 110 electrically connects upper active die 106 and lower active die 112. However, in other implementations, upper active die 106 and lower active die 112 are electrically connected through other means. For example, in one implementation, additional solder balls surround solder balls 134 and heat spreader 110 and electrically connect upper active die 106 and lower active die 112 through upper package substrate 108. In some implementations, conductive vias extend through and are electrically insulated from heat spreader 110 to electrically connect upper active die 106 and lower active die 112. The conductive vias can be connected to at least some of solder balls 134. It will be appreciated that upper active die 106 and lower active die 112 can be electrically connected in many ways other than the examples given above. Furthermore, in some implementations, upper active die 106 and lower active die 112 are not electrically connected.

Figure 3A:
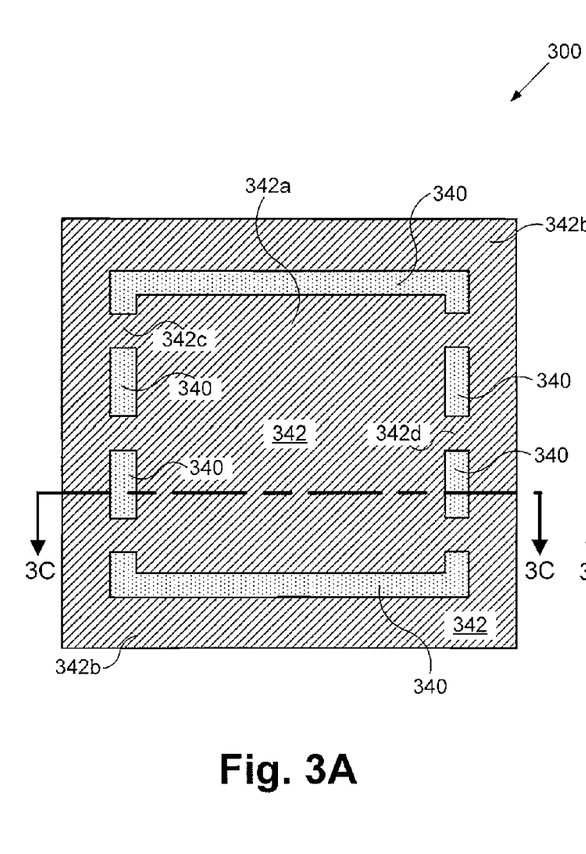
FIG. 3A presents an exemplary top view of a heat spreading package, according to an implementation disclosed in the present application.
Figure 3B:
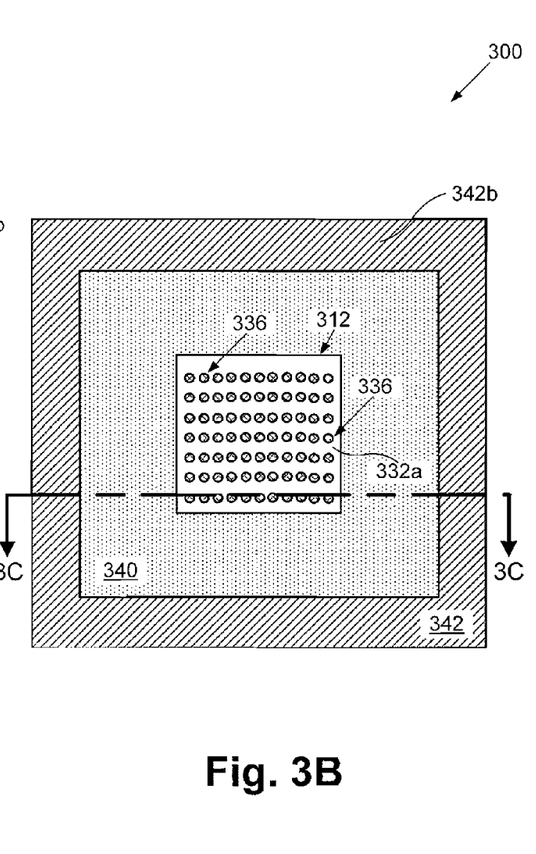
FIG. 3B presents an exemplary bottom view of a heat spreading package, according to an implementation disclosed in the present application.
Figure 3C:
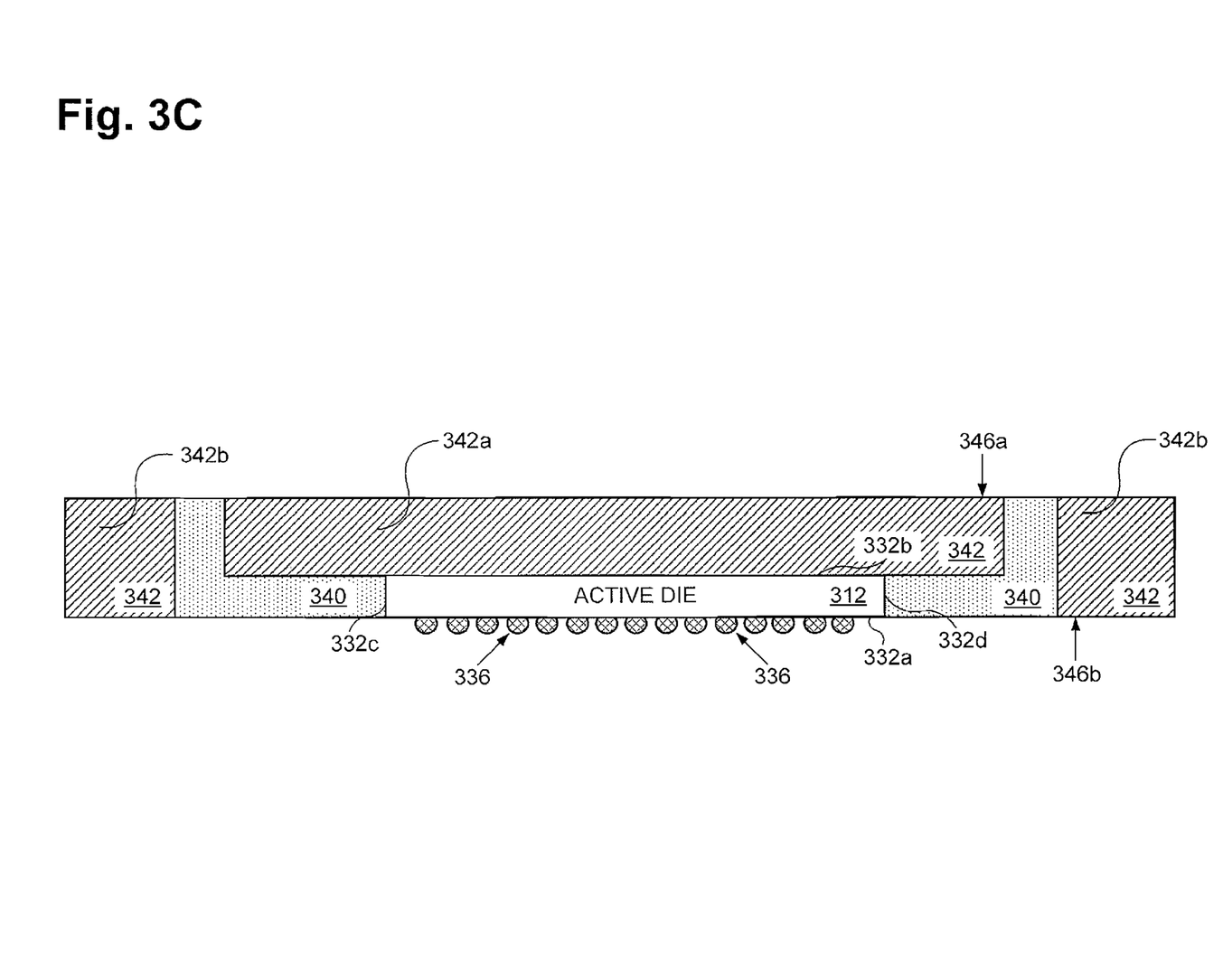
FIG. 3C presents an exemplary cross-sectional view of a heat spreading package, according to an implementation disclosed in the present application.

Referring now to FIGS. 3A, 3B, and 3C, FIG. 3A presents an exemplary top view of heat spreading package 300, FIG. 3B presents an exemplary bottom view of heat spreading package 300, and FIG. 3C presents an exemplary cross-sectional view of heat spreading package 300, according to an implementation disclosed in the present application. The cross-sectional view of heat spreading package 300, shown in FIG. 3C, corresponds to cross-section 3C-3C in FIGS. 3A and 3B.

Heat spreading package 300 includes active die 312, leadframe 342, and thermal interface material 340. In various implementations, active die 312 includes at least one active component and can also include one or more passive components. Active die 312 can be, for example, a semiconductor die, such as a silicon die. Active die 312 has surfaces 332a and 332b with micro bumps 336 situated on surface 332a. Micro bumps 336 are electrically connected to active die 312 through surface 332a.

Leadframe 342 includes leadframe paddle 342a and leadframe periphery 342b. Leadframe 342 can be a conductive leadframe, such as a metal or metal alloy leadframe. In one implementation, leadframe 342 is a copper leadframe. As shown in FIG. 3A, leadframe periphery 342b is surrounding leadframe paddle 342a. In some implementations, leadframe periphery 342b is not connected to leadframe paddle 342a. Furthermore, some implementations do not include leadframe periphery 342b. However, in the present implementation, leadframe periphery 342b is connected to leadframe paddle 342a. More particularly, leadframe periphery 342b is integrally connected to leadframe paddle 342a by a plurality of bridge portions, such as bridge portions 342c and 342d. Bridge portions 342c and 342d are on opposing sides of leadframe paddle 342a.

In heat spreading package 300, thermal interface material 340 is situated between leadframe periphery 342b and leadframe paddle 342a and thermally couples leadframe periphery 342b to leadframe paddle 342a. In the present implementation, thermal interface material 340 is substantially flush with surfaces 346a and 346b of leadframe 342, as shown in FIG. 3C. Furthermore, leadframe paddle 346b and thermal interface material 340 are substantially flush with surface 332a of active die 312. Also in the present implementation, active die 312 is physically and thermally coupled to thermal interface material 340 on all side surfaces of active die 312, including surfaces 332c and 332d.

Also in heat spreading package 300, active die 312 has surface 332b coupled to leadframe paddle 342a. Leadframe paddle 342a is configured to dissipate heat from active die 312. Thus, leadframe paddle 342a can effectively address heat related issues, such as thermal expansion and heat dissipation considerations, in heat spreading package 300. Although not shown, heat spreading package 300 can include thermal interface material on surface 332b, which can be similar to or different than thermal interface material 130 in FIG. 1 and thermal interface material 230 in FIGS. 2A and 2B. The thermal interface material can enhance heat dissipation through surface 332b of active die 312. Furthermore, in the implementation shown, heat dissipation is also enhanced by thermal interface material 340, which dissipates heat laterally from side surfaces, such as surfaces 332c and 332d, of active die 312.

While leadframe paddle 342a (and optionally any of thermal interface material 340, leadframe periphery 342b, and bridge portions 342c and 342d) can be sufficient to address heat related issues in heat spreading package 300, in some implementations a heat spreader is attached to heat spreading package 300 (e.g. on surface 346a). However, because leadframe paddle 342a is configured to dissipate heat from active die 312, the heat spreader can be small and inexpensive. The heat spreader can correspond to heat spreader 450 shown in FIG. 4.

Figure 4:
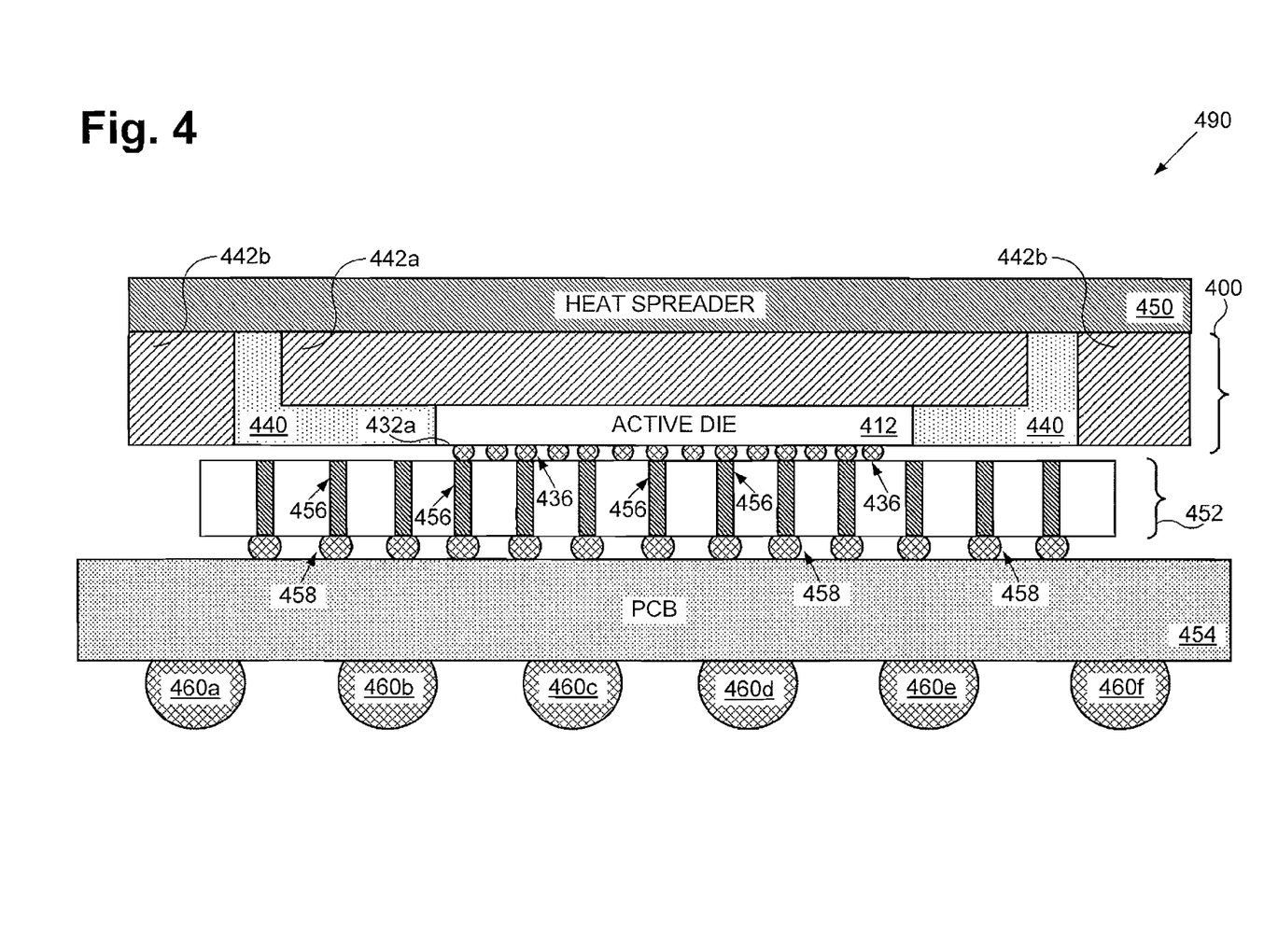
FIG. 4 presents an exemplary cross-sectional view of a heat spreading package assembly, according to an implementation disclosed in the present application.

Referring to FIG. 4, FIG. 4 presents an exemplary cross-sectional view of heat spreading package assembly 490, according to an implementation disclosed in the present application. Heat spreading package assembly 490 includes heat spreading package 400, interposer 452, and printed circuit board (PCB) 454. Heat spreading package 400 corresponds to heat spreading package 300 in FIGS. 3A, 3B, and 3C. Thus, micro bumps 436 are situated on surface 432a of active die 412.

Interposer 452 has vias 456, at least some of which are coupled to at least some of micro bumps 436. Interposer 452 can be any suitable interposer. In the present implementation, interposer 452 comprises semiconductor material and vias 456 are through semiconductor vias (TSVs). For example, interposer 452 can be silicon with vias 456 being through silicon vias. In interposer 452 can include other structures and layers not specifically shown in FIG. 4. Interposer 452 is electrically connecting heat spreading package 400 to PCB 454. In heat spreading package assembly 490, solder balls 458 are electrically connecting at least some vias 456 vias to printed circuit board 454. Also shown in FIG. 4, heat spreading package assembly 490 can optionally include solder balls 460a, 460b, 460c, 460d, 460e, and 460 (also referred to as "solder balls 460") under PCB 454. At least some of solder balls 460 can be electrically connected to at least some of solder balls 458 through PCB 454. As such, solder balls 460 can be electrically connected to active die 412.

As described above, leadframe paddle 442a is configured to dissipate heat from active die 412. Thus, leadframe paddle 442a can effectively address heat related issues, such as thermal expansion and heat dissipation considerations, in heat spreading package 400. Furthermore, leadframe periphery 442b and thermal interface material 440 are configured to dissipate heat from active die 412. Thus, leadframe periphery 442b and thermal interface material 440 can enhance heat dissipation of heat spreading package 400. In addition, leadframe periphery 442b and thermal interface material 440 enhance structural integrity of heat spreading package assembly 490 while increasing thermal contact area between heat spreading package 400 and optional heat spreader 450. In FIG. 4, Leadframe paddle 442a, leadframe periphery 442b, and thermal interface material 440 are each thermally coupled to heat spreader 450.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the spirit and the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A semiconductor package stack comprising:
an upper package coupled to a lower package by a plurality of solder balls;
a lower active die situated in a lower package substrate, said lower active die thermally coupled to a heat spreader in said upper package by a thermal interface material;
an upper active die situated in an upper package substrate, said upper package substrate situated over said heat spreader;
said heat spreader comprising a layer of metal or metal alloy on a bottom surface of said upper package and thermally coupled to said thermal interface material.

2. The semiconductor package stack of claim 1, wherein said heat spreader further comprises a heat spreader dielectric situated between said layer of metal or metal alloy and said upper package substrate.

3. The semiconductor package stack of claim 1, wherein said plurality of solder balls is situated under said heat spreader.

4. The semiconductor package stack of claim 1, wherein said heat spreader is coupled to ground.

5. The semiconductor package stack of claim 1, wherein said heat spreader is connected to a DC supply voltage.

6. The semiconductor package stack of claim 1, wherein said thermal interface material comprises an array of aligned carbon nanotubes within a filler material.

7. The semiconductor package stack of claim 1, wherein said thermal interface material comprises an array of aligned carbon nanotubes that extend from said lower active die to said heat spreader.

8. The semiconductor package stack of claim 1, wherein said thermal interface material comprises an array of aligned carbon nanotubes that directly contact said lower active die.

9. A semiconductor package stack comprising:
an upper package situated over a lower package;
a lower active die situated in a lower package substrate in said lower package, said lower active die thermally coupled to a heat spreader in said upper package by a thermal interface material;
an upper active die situated in an upper package substrate in said upper package, said upper package substrate situated over said heat spreader;
said heat spreader comprising a layer of metal or metal alloy on a bottom surface of said upper package and thermally coupled to said thermal interface material.

10. The semiconductor package stack of claim 9, wherein said heat spreader further comprises a heat spreader dielectric situated between said layer of metal or metal alloy and said upper package substrate.

11. The semiconductor package stack of claim 9, wherein a plurality of solder balls is situated under said heat spreader.

12. The semiconductor package stack of claim 11, wherein said heat spreader is connected to ground.

13. The semiconductor package stack of claim 11, wherein said heat spreader is connected to a DC supply voltage.

14. The semiconductor package stack of claim 9, wherein said thermal interface material comprises an array of aligned carbon nanotubes within a filler material.

15. A heat spreading package assembly comprising:
an active die having a first surface coupled to a leadframe paddle, said leadframe paddle configured to dissipate heat from said active die;
a thermal interface material situated between a leadframe periphery and the leadframe paddle;
a plurality of micro bumps on a second surface of said active die;
an interposer having a plurality of vias electrically coupled to at least some of said plurality of micro bumps;
a plurality of solder balls coupling at least some of said plurality of vias to a printed circuit board.

16. The heat spreading package assembly of claim 15, wherein the leadframe periphery surrounds said leadframe paddle.

17. The heat spreading package assembly of claim 15, wherein said leadframe periphery is integrally connected to said leadframe paddle.

18. The heat spreading package assembly of claim 15, wherein the thermal interface material thermally couples said leadframe periphery and said leadframe paddle.

19. The heat spreading package assembly of claim 15, wherein said active die is physically and thermally coupled to the thermal interface material.

20. The heat spreading package assembly of claim 15, wherein said leadframe paddle is coupled to a heat spreader.

\* \* \* \* \*